(12) United States Patent
Pavier

(10) Patent No.: US 6,723,620 B1
(45) Date of Patent: Apr. 20, 2004

(54) POWER SEMICONDUCTOR DIE ATTACH PROCESS USING CONDUCTIVE ADHESIVE FILM

(75) Inventor: Mark Pavier, Guildford (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/718,932

(22) Filed: Nov. 22, 2000

Related U.S. Application Data
(60) Provisional application No. 60/187,456, filed on Nov. 24, 1999.

(51) Int. Cl.$^7$ .................. H01L 21/301; H01L 21/46; H01L 21/78
(52) U.S. Cl. .................. 438/460; 438/465; 438/113; 438/114; 438/118
(58) Field of Search .................. 438/111, 118, 438/123, 458, 462, 464

(56) References Cited

U.S. PATENT DOCUMENTS

| | | | | |
|---|---|---|---|---|
| 4,664,739 A | * | 5/1987 | Aurichio | 156/344 |
| 4,688,075 A | * | 8/1987 | Phy | 357/80 |
| 4,793,883 A | * | 12/1988 | Sheyon et al. | 156/235 |
| 5,084,753 A | * | 1/1992 | Goida et al. | 257/685 |
| 5,110,388 A | * | 5/1992 | Komiyama et al. | 156/229 |
| 5,221,642 A | * | 6/1993 | Burns | 437/207 |
| 5,286,679 A | | 2/1994 | Farnworth et al. | |
| 5,411,921 A | | 5/1995 | Negoro | |
| 5,422,435 A | * | 6/1995 | Takiar et al. | 174/52.4 |
| 5,478,781 A | * | 12/1995 | Bertin et al. | 437/209 |
| 5,656,553 A | * | 8/1997 | Leas et al. | 438/15 |
| 5,776,799 A | | 7/1998 | Song et al. | |
| 5,843,251 A | * | 12/1998 | Tsukagoshi et al. | 158/64 |
| 5,849,607 A | * | 12/1998 | Seo et al. | 438/114 |
| 5,882,956 A | * | 3/1999 | Umehara et al. | 438/114 |
| 5,897,337 A | * | 4/1999 | Kata et al. | 438/114 |
| 5,904,546 A | * | 5/1999 | Wood et al. | 438/460 |
| 5,943,557 A | * | 8/1999 | Moden | 438/118 |
| 5,960,260 A | | 9/1999 | Umehara et al. | |
| 6,033,931 A | * | 3/2000 | Hoffman et al. | 438/109 |
| 6,117,347 A | * | 9/2000 | Ishida | 216/52 |
| 6,136,137 A | * | 10/2000 | Farnworth et al. | 156/344 |
| 6,215,194 B1 | * | 4/2001 | Nakabayashi | 257/782 |
| 6,271,102 B1 | * | 8/2001 | Brouillette et al. | 438/462 |
| 6,303,471 B1 | * | 10/2001 | Unno et al. | 438/464 |

OTHER PUBLICATIONS

International Search Report dated Mar. 20, 2001 for corresponding International Application No. PCT/US00/32176.

* cited by examiner

*Primary Examiner*—John F. Niebling
*Assistant Examiner*—Angel Roman
(74) *Attorney, Agent, or Firm*—Ostrolenk, Faber, Gerb & Soffen, LLP

(57) ABSTRACT

A large area adhesive film is attached to a semiconductor wafer containing a large number of identical structures. The film and wafer are then simultaneously singulated and the individual die with film thereon are then placed atop a lead frame and the film is completely cured to adhere the semiconductor die to the lead frame. Plural die can be mounted side-by-side on a common substrate, or one die can be mounted atop a second die which is on the substrate.

10 Claims, 2 Drawing Sheets

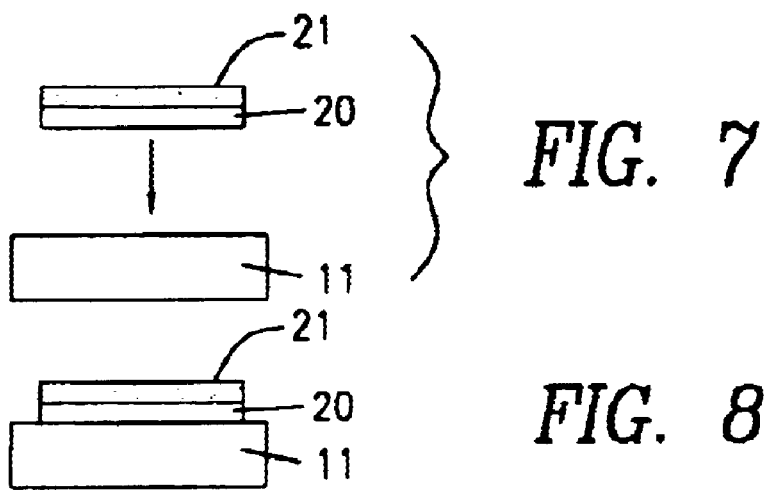
FIG. 7
FIG. 8
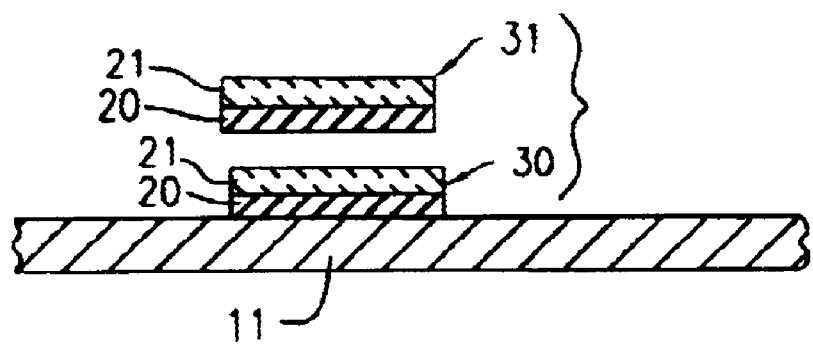
FIG. 9
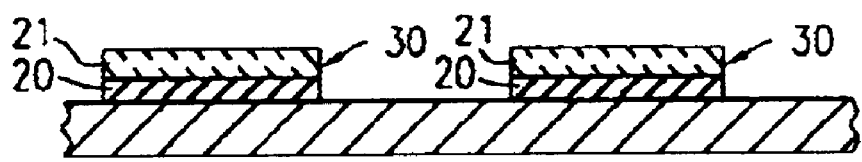
FIG. 10

POWER SEMICONDUCTOR DIE ATTACH PROCESS USING CONDUCTIVE ADHESIVE FILM

RELATED APPLICATIONS

This application relates to and claims the filing date of United States Provisional Application Ser. No. 60/167,456 (IR-1773 PROV (2-2141)), filed Nov. 24, 1999.

BACKGROUND OF THE INVENTION

This invention relates to semiconductor devices and more specifically relates to a novel process for the attachment of power semiconductor die to a thermally and/or electrically conductive support.

Power semiconductor die such as diodes, MOSFETs, IGBTs and the like are normally attached to conductive lead frames or other substrates by electrically conducting materials such as epoxies, thermoplastics, solders and the like or by electrically insulative materials if electrical isolation is desired. This process is carried out sequentially for individual due, after die singulation from a wafer and is time consuming.

BRIEF DESCRIPTION OF THE INVENTION

In accordance with the invention adhesive films which may be electrically conductive or insulative are used as the die attach material for power semiconductors. Further, such adhesive films are attached to power semiconductor wafers before the die singulation stage.

Adhesive films are now used lo bond low power integrated circuits to lead frames. In accordance with the invention, electrically conductive or insulative adhesive films are used to bond power semiconductors to substrates lead frames.

Adhesive films in the prior art are pre-cut and placed onto a substrate before the placement of die on the film. The resultant substrate/film/die assembly is then partially heat treated to promote adhesion between die/lead frame. In accordance with the invention, the adhesive film is placed onto the power semiconductor wafer before the die singulation stage. The wafer/adhesive film stack is then sawn using conventional singulation methods producing die with the adhesive film pre-attached. The sawn die/film stack is then placed onto a substrate/lead frame before re-activating the adhesive via heat treatment to promote bonding and complete the curing.

There are a number of benefits provided by the invention. Thus, conventional power semiconductor die attach involves use of epoxy or solder type adhesives in paste or liquid form. These materials often overspill from the edge of the die onto the substrate/lead frame during die bonding. This overspill limits the size of die that can be placed on the lead frame/substrate. By using an adhesive film, such overspill is eliminated. Larger die can then be placed in a package of a given size. Bond line thickness is also set by the adhesive film thickness and will be constant. Voids in the bond will also be absent.

Pre-bonding electrically conductive or (electrically isolating) adhesive film onto the power semiconductor wafer before die singulation also removes the requirement of an extra pick and place stage during assembly. Manufacturing equipment costs and cycle times are therefore reduced.

BRIEF DESCRIPTION OF THE DRAWINGS

FIG. 7 shows one die/film stack singulated from the assembly of FIG. 6 before attachment to a substrate.

FIG. 8 shows the assembly of FIG. 7 after heat cure and bonding.

FIG. 9 shows the process of the invention as applied to a die-on-die assembly.

FIG. 10 shows the process of the invention as applied to a side-by-side assembly of die on a common substrate.

DETAILED DESCRIPTION OF EMBODIMENTS OF THE INVENTION

Figure 1:
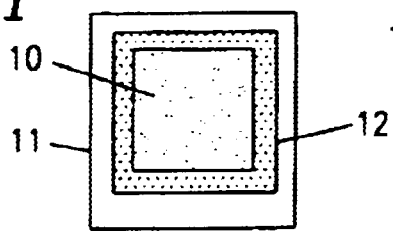
FIGS. 1 and 2 are top and side views respectively of a prior art die attach.
Figure 2:
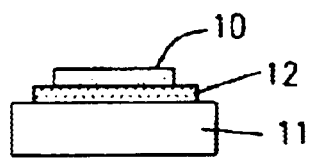

FIGS. 1 and 2 show a prior art power semiconductor die 10 and a conductive substrate 12 to which it is attached by a solder or epoxy attach material 11. Note that material 11 conventionally overspills, thereby limiting the maximum size of the die on a substrate of given area.

Figure 3:
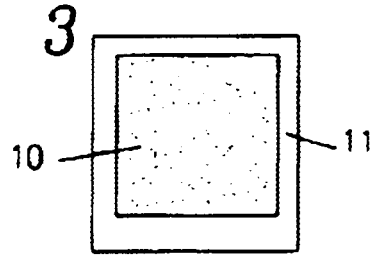
FIGS. 3 and 4 are top and side views respectively of a power semiconductor die attached to a substrate by a conductive adhesive film.
Figure 4:
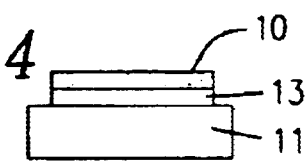

FIGS. 3 and 4 show the die 10 of FIGS. 1 and 2 where a thin, flexible adhesive film 13 is used to bond the die 10 and substrate 12. Film 13 is electrically conductive or may be insulative, and is heat curable. The use of such film is seen in FIGS. 2 and 4 to eliminate overspill, thus enabling a larger area die 10 on the substrate 11 of same area as that of FIGS. 1 and 2.

Figure 5:
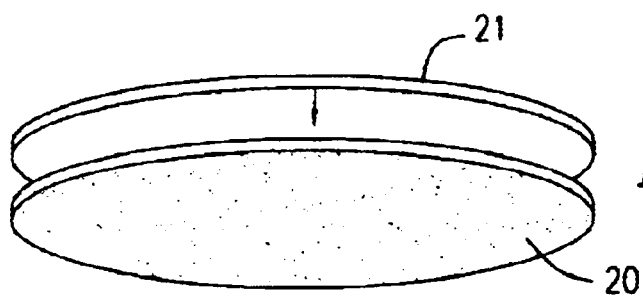
FIG. 5 is a perspective diagram of a large area adhesive film and a semiconductor device wafer before singulation.

The novel process of the invention is shown in FIGS. 5 to 8. FIG. 5 shows a semiconductor device wafer 21 which contains a large number of identical power semiconductor die which are simultaneously processed in a conventional manner. Thus, the wafer can contain hundreds of identical vertical conduction power MOSFET die which have PJN junctions in their top surface, conventionally covered by a conductive source electrode and a bottom conductive drain electrode. The die of the wafer are singulated by sawing the wafer with conventional sawing apparatus. The individual die are then to be mounted on a lead frame or other substrate by soldering or epoxy bonding the drain electrode of the die to the substrate.

In accordance with the invention an adhesive film 20 is cut to the size of the wafer, which can have a typical diameter of about 6 inches.

Film 20 is preferably a polyimide film such as that know as a "KAPTON" film which is frequently used in PC boards, "flex" circuits, for electrical winding insulation and the like. The Kaplon polyimide is an excellent insulator. The wafer 21 and film 20 are then laid atop one another and are preheated to promote adhesion, but to not fully cure the film 20.

Figure 6:
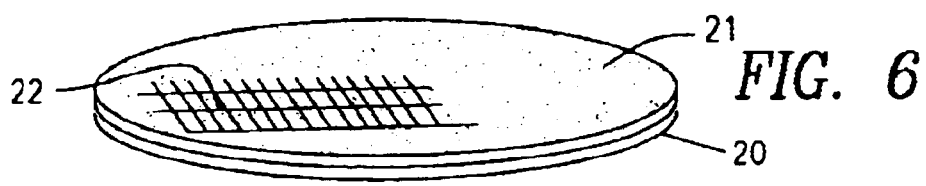
FIG. 6 is a perspective diagram of FIG. 5 after adhesion.

Thereafter, and as schematically shown in FIG. 6 the film 20 and wafer 21 are simultaneously sawn at cut lines 22 into separate die. A conventional frame or support keeps the separated film/die stacks in place and the stacks are then placed into a conventional pick and place device so that the singulated devices can be picked up and carried to a location to be mounted on respective heated lead frames or substrates in an automated manner.

Thus, as shown in FIG. 7 the die/film stack 21/20 can be picked up and placed atop a respective substrate 11 with a conventional pick and place apparatus. Pressure is preferably applied to press the stack 21/20 onto the surface of the pre-heated substrate 11.

Thereafter, the die/film stack 21/20 and substrate 11 are heated to about 260° C. to fully heat cure film 20 to form a bond to the substrate 11.

The structure of FIGS. 7 and 8 can also be carried out to form die-on-die packages (FIG. 9) or side-by-side die packages (FIG. 10). Thus, in FIG. 9 two identical die 30 and 31 or die with un-equal dimensions having adhesive layers 20 and semiconductor die 21 may be mounted with die 31 atop die 30. Die 30 and 31 may be diverse devices, for example a MOSFET and a Schottky diode respectively and may be of different sizes or areas. Alternatively, die 31 can be an integrated circuit.

Further, layers 20 in FIG. 9 can be a suitable electrically conductive adhesive film to allow back-to-back connection of die 30 and 31.

As shown in FIG. 10, the die 30 and 31 may contain a MOSFET and an IC respectively (die 21).

Other film which can be used for film 20 includes thermoplastic adhesive paste such as Alpha Metals 383G (RHS) and UH2W-E polyimide film (LHS).

Although the present invention has been described in relation to particular embodiments thereof, many other variations and modifications and other uses will become apparent to those skilled in the art. It is preferred, therefore, that the present invention be limited not by the specific disclosure herein but only by the appended claims.

I claim:

1. A process of connecting semiconductor die to a substrate having a top surface, said process comprising the steps of:
    providing a thin, flexible, heat curable, polyimide, insulative film which is of a first area;
    laying said thin flexible film on a semiconductor wafer of a second area, said semiconductor wafer being provided with a plurality of spaced apart semiconductor die, each of said semiconductor die having a respective third area which is substantially less than said first area;
    preheating said semiconductor wafer and said thin flexible film without applying any external pressure to partially cure said thin flexible film, thereby forming adhesion between said thin flexible film and said semiconductor wafer,
    thereafter simultaneously singulating both said thin flexible film and said plurality of identical semiconductor die to form individual elements;
    heating said substrate;
    thereafter placing at least one of said singulated semiconductor die on the top surface of said heated substrate with the thin flexible film on said die pressed against said top surface and adhered thereto; and
    thereafter heating said semiconductor die and said substrate to a curing temperature to fully cure said thin flexible film to firmly adhere said semiconductor die to said substrate.

2. The process of claim 1 wherein said substrate is a conductor lead frame.

3. The process of claim 1 wherein said film on said die has the same or different area as that of said die after assembly onto said substrate.

4. The process of claim 1 which includes a further step of adhering a second semiconductor die with a second thin flexible adhesive film thereon to said substrate at a position laterally removed from the first die.

5. The process of claim 1 which includes the further step of adhering a second die with a second adhesive film thereon to the top of said die secured to said substrate.

6. The process of claim 1 wherein said first area is substantially identical to, or different from, said second area.

7. The process of claim 1 wherein said die and film are moved to said substrate by pick-and-place apparatus.

8. The process of claim 1 wherein said adhesive film has a smaller area than said top surface of said die.

9. The process of claim 5 wherein said adhesive film has a smaller area than said top surface of said die and wherein said second die and said second adhesive film both have the same area as said adhesive film.

10. A method of manufacturing a semiconductor device comprising the steps of:
    providing a wafer with a plurality of spaced apart semiconductor elements;
    laying a thin, flexible, polyimide, insulative film, which is separate from said wafer, and said wafer atop one another to form a film/wafer structure;
    preheating said film/wafer structure without arriving any external pressure to partially cure said thin flexible film, thereby forming adhesion between said thin flexible film and said wafer;
    singulating said film/wafer structure with said partially cured thin flexible film, thereby forming a plurality of individual semiconductor dies;
    heating said substrate;
    placing at least one individual semiconductor die with said partially cured thin flexible film, which faces a substrate, on the said heated substrate; and
    applying heat to fully cure said thin flexible film, thereby bonding said individual semiconductor die with said substrate.

* * * * *

UNITED STATES PATENT AND TRADEMARK OFFICE
CERTIFICATE OF CORRECTION

PATENT NO. : 6,723,620 B1
DATED : April 20, 2004
INVENTOR(S) : Mark Pavier

It is certified that error appears in the above-identified patent and that said Letters Patent is hereby corrected as shown below:

<u>Title page,</u>
Item [60], Related U.S. Application Data, should read:
-- Provisional application No. 60/167,456, filed on Nov. 24, 1999. --

Signed and Sealed this

Twenty-third Day of November, 2004

JON W. DUDAS
*Director of the United States Patent and Trademark Office*